(12) United States Patent
Gouchi (10) Patent No.: US 12,003,012 B2
(45) Date of Patent: Jun. 4, 2024

(54) ANTENNA MODULE

(71) Applicant: Murata Manufacturing Co., Ltd., Nagaokakyo (JP)

(72) Inventor: Naoki Gouchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 192 days.

(21) Appl. No.: 17/870,864

(22) Filed: Jul. 22, 2022

(65) Prior Publication Data

US 2022/0368031 A1 Nov. 17, 2022

Related U.S. Application Data

(63) Continuation of application No. PCT/JP2020/046239, filed on Dec. 11, 2020.

(30) Foreign Application Priority Data

Jan. 27, 2020 (JP) ................. 2020-010995

(51) Int. Cl.
*H01Q 1/02* (2006.01)
*H01Q 1/22* (2006.01)
(Continued)

(52) U.S. Cl.
CPC ............ *H01Q 1/02* (2013.01); *H01Q 1/2283* (2013.01); *H01Q 9/0407* (2013.01);
(Continued)

(58) Field of Classification Search
CPC ........ H01Q 1/02; H01Q 1/243; H01Q 1/2283; H01Q 5/307; H01Q 9/0407; H01Q 21/06;
(Continued)

(56) References Cited

U.S. PATENT DOCUMENTS

2015/0042420 A1   2/2015   Toonen
2020/0373655 A1*  11/2020  Takayama ................ H01Q 1/40

FOREIGN PATENT DOCUMENTS

JP   2005-286794 A   10/2005
JP   2014-78835 A    5/2014
(Continued)

OTHER PUBLICATIONS

International Search Report and Written Opinion mailed on Feb. 16, 2021, received for PCT Application PCT/JP2020/046239, filed on Dec. 11, 2020, 10 pages including English Translation.
(Continued)

*Primary Examiner* — Robert Karacsony
(74) *Attorney, Agent, or Firm* — XSENSUS LLP (57) ABSTRACT

An antenna module includes a radiating element and a dielectric substrate. The dielectric substrate includes a flat portion on which an external terminal (T) to which a RFIC is connected is disposed, a flat portion in which the radiating element is disposed, a bent portion, a feeder, and a ground electrode (GND1). The feeder extends through the flat portions and the bent portion to connect the external terminal (T) and the radiating element to each other. The ground electrode (GND1) extends through the flat portions and the bent portion along the feeder. At the bent portion, a thickness of the feeder is greater than a thickness of the ground electrode (GND1).

20 Claims, 7 Drawing Sheets

(51) Int. Cl.
  *H01Q 1/24* (2006.01)
  *H01Q 9/04* (2006.01)
  *H01Q 21/08* (2006.01)
  *H01Q 23/00* (2006.01)
  *H01Q 25/00* (2006.01)
  *H05K 1/02* (2006.01)

(52) U.S. Cl.
  CPC ............ *H01Q 21/08* (2013.01); *H01Q 23/00* (2013.01); *H01Q 25/00* (2013.01); *H01Q 1/243* (2013.01); *H05K 1/0207* (2013.01)

(58) Field of Classification Search
  CPC .... H01Q 21/08; H01Q 21/0025; H01Q 23/00; H01Q 25/00; H01P 3/08; H01P 3/081; H01P 3/082; H05K 1/0201; H05K 1/0203; H05K 1/0204; H05K 1/0206; H05K 1/0207; H05K 1/0209; H05K 1/021; H05K 1/0212
  See application file for complete search history.

(56) References Cited

FOREIGN PATENT DOCUMENTS

| | | |
|---|---|---|
| JP | 6773259 B1 | 10/2020 |
| WO | 2019/130771 A1 | 7/2019 |
| WO | 2019/163376 A1 | 8/2019 |

OTHER PUBLICATIONS

Written Opinion of the International Searching Authority mailed on Feb. 16, 2021, received for PCT Application PCT/JP2020/046239, filed on Dec. 11, 2020, 5 pages. (Previously Filed; Submitting English Translation only).

* cited by examiner

ANTENNA MODULE

CROSS-REFERENCE TO RELATED APPLICATIONS

The present application is a continuation application of International Patent Application No. PCT/JP2020/046239, filed Dec. 11, 2020, which claims priority to Japanese Patent Application No. 2020-010995, filed Jan. 27, 2020, the entire contents of each of which being incorporated herein by reference.

TECHNICAL FIELD

The present disclosure relates to an antenna module including a dielectric substrate including a bent portion in or on which a feeder that connects an external terminal and a radiating element to each other is disposed.

BACKGROUND ART

International Publication No. 2019/163376 describes an antenna module including a feeding component (radio frequency integrated circuit or RFIC), a radiating element (antenna element), and a dielectric substrate with a flat shape. The dielectric substrate includes a surface on which the feeding component is disposed, a surface on which the radiating element is disposed, a feeder that extends inside the dielectric substrate to connect the feeding component and the antenna element to each other, and a ground electrode that extends along the surface on which the feeding component is disposed. When a radio frequency signal is provided from the feeding component to the radiating element through the feeder, a radio wave is radiated from the radiating element.

CITATION LIST

Patent Document

Patent Document 1: International Publication No. 2019/163376

SUMMARY

Technical Problems

A feeding component in an antenna module generally generates heat when the feeding component provides a radio frequency signal to a radiating element. Thus, the antenna module is desired to facilitate dissipation of heat caused by the feeding component to the outside.

The antenna module described in International Publication No. 2019/163376 includes the dielectric substrate with a flat shape. Thus, the length of the feeder that connects the feeding component and the radiating element can be relatively shortened. The heat generated by the feeding component can thus be easily transmitted to the radiating element through the feeder, and the heat generated by the feeding component can be easily dissipated to the outside from the radiating element.

However, some antenna modules include a dielectric substrate having a partially bent shape, and in which a bent portion connects a first flat portion on which an external terminal to which a feeding component is connected is disposed, and a second flat portion on which a radiating element is disposed with each other. In such a structure, the feeder has a large length, and heat generated by the feeding component is less easily transmitted to the radiating element through the feeder. This structure thus less easily allows the heat generated by the feeding component to dissipate from the radiating element.

The present disclosure is made to solve the above problem, as well as other problems, and aims to provide an antenna module including a dielectric substrate including a bent portion in or on which a feeder that connects an external terminal and a radiating element to each other is disposed, and the antenna module securing heat radiation properties.

Solutions to Problems

An antenna module according to one aspect of the present disclosure includes a first radiating element and a dielectric substrate. The dielectric substrate includes a first flat portion on which an external terminal is disposed, a second flat portion in which a first radiating element is disposed, a bent portion that connects the first flat portion and the second flat portion to each other, a first feeder, and a first ground electrode. The first feeder extends through the first flat portion, the bent portion, and the second flat portion to connect the external terminal and the first radiating element to each other. The first ground electrode extends through the first flat portion, the bent portion, and the second flat portion along the first feeder. A thickness of the first feeder at the bent portion is greater than a thickness of the first ground electrode at the bent portion.

In the above antenna module, at the bent portion, the thickness (the dimension in the direction normal to the bent portion) of the feeder is greater than the thickness of the first ground electrode. This structure facilitates transmission of heat of the first flat portion on which the external terminal is disposed to the second flat portion through the feeder at the bent portion, and dissipation of the heat outside and away from the first radiating element. The antenna module with this structure thus secures heat radiation properties.

Advantageous Effects of Disclosure

An antenna module according to the present disclosure includes a dielectric substrate including a bent portion in or on which a feeder that connects an external terminal and a radiating element to each other is disposed. The antenna module can secure heat radiation properties.

DESCRIPTION OF EMBODIMENTS

Embodiments of the present disclosure will be described below in detail with reference to the drawings. Throughout the drawings, the same or corresponding components will be denoted with the same reference signs without being described redundantly.

(Basic Structure of Communication Device)

Figure 1:
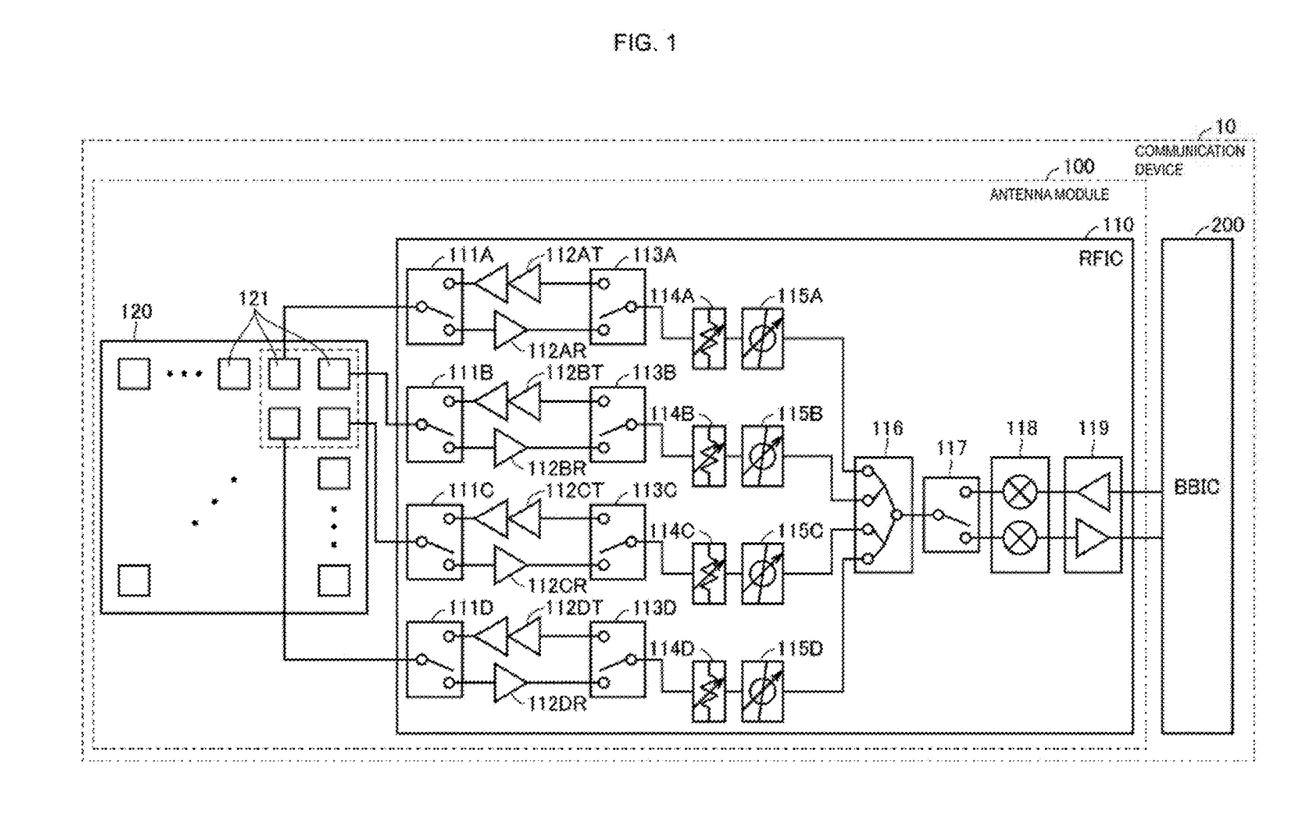
FIG. 1 is an example block diagram of a communication device to which an antenna module is applied.

FIG. 1 is an example block diagram of a communication device 10 to which an antenna module 100 according to the present embodiment is applied. Examples of the communication device 10 include a portable terminal such as a mobile phone, a smartphone, or a tablet computer, and a personal computer having a communication function. For example, a frequency bandwidth of radio waves used for the antenna module 100 according to the present embodiment includes radio waves in an extremely-radio frequency (RF) band having, for example, 28 GHz, 39 GHz, or 60 GHz as a center frequency, but is also applicable to radio waves in other frequency bandwidths.

With reference to FIG. 1, the communication device 10 includes the antenna module 100 and a baseband integrated circuit (BBIC) 200 forming a baseband signal processing circuit. The antenna module 100 includes a radio frequency integrated circuit (RFIC) 110, serving as an example of a feeding component, and an antenna device 120. The communication device 10 upconverts a signal transmitted from the BBIC 200 to the antenna module 100 into a radio frequency signal, and radiates the signal from the antenna device 120. The communication device 10 also downconverts a radio frequency signal received at the antenna device 120, and processes the signal at the BBIC 200.

For ease of illustration, FIG. 1 illustrates only four radiating elements of multiple radiating elements 121 forming the antenna device 120, and omits illustration of other radiating elements 121 having the same structure. Although FIG. 1 illustrates an example where the antenna device 120 includes multiple radiating elements 121 arranged in a two-dimensional array, the antenna device 120 may include only one radiating element 121 instead of multiple radiating elements 121. The multiple radiating elements 121 may be arranged linearly or in a one-dimensional array. In the present embodiment, each radiating element 121 is a patch antenna having a substantially square flat shape.

The RFIC 110 includes switches 111A to 111D, 113A to 113D, and 117, power amplifiers 112AT to 112DT, low-noise amplifiers 112AR to 112DR, attenuators 114A to 114D, phase shifters 115A to 115D, a multiplexer/diplexer 116, a mixer 118, and an amplifier circuit 119.

To transmit a radio frequency signal, the switches 111A to 111D and 113A to 113D are switched to the power amplifiers 112AT to 112DT, and the switch 117 is connected to a transmission amplifier of the amplifier circuit 119. To receive a radio frequency signal, the switches 111A to 111D and 113A to 113D are switched to the low-noise amplifiers 112AR to 112DR, and the switch 117 is connected to a receiving amplifier of the amplifier circuit 119.

A signal transmitted from the BBIC 200 is amplified by the amplifier circuit 119, and upconverted by the mixer 118. A transmission signal or an upconverted radio frequency signal is divided into four pieces by the multiplexer/diplexer 116, and the four pieces pass through four signal paths to be provided to various different radiating elements 121. At this time, the phase shifts of the phase shifters 115A to 115D disposed on the respective signal paths are individually adjusted to adjust the directivity of the antenna device 120.

Received signals or radio frequency signals received by the respective radiating elements 121 respectively pass different four signal paths, and are multiplexed by the multiplexer/diplexer 116. The multiplexed received signal is down-converted by the mixer 118, amplified by the amplifier circuit 119, and transmitted to the BBIC 200.

The RFIC 110 is, for example, a component of an integrated circuit chip including the above circuit structure. Alternatively, a device (a switch, a power amplifier, a low-noise amplifier, an attenuator, or a phase shifter) corresponding to each radiating element 121 in the RFIC 110 may be formed as a component of an integrated circuit chip for the corresponding radiating element 121.

(Structure of Antenna Module)

Subsequently, a structure of the antenna module 100 according to the present embodiment will be described in detail.

Figure 2:
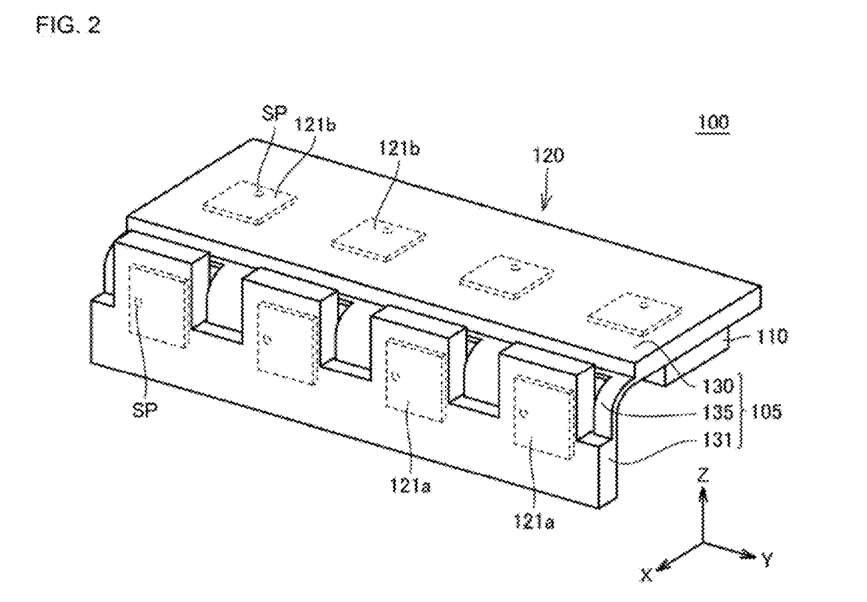
FIG. 2 is a perspective view (Variation 1) of an antenna module.

FIG. 2 is a perspective view of the antenna module 100. As described above, the antenna module 100 includes the antenna device 120 and the RFIC 110. The antenna device 120 includes the radiating elements 121 (radiating elements 121a and 121b) and a dielectric substrate 105.

The dielectric substrate 105 is, for example, a multilayer substrate formed from low-temperature co-fired ceramics (LTCC), a multilayer resin substrate formed by laminating multiple resin layers formed from a resin such epoxy or polyimide, a multilayer resin substrate formed by laminating multiple resin layers formed from a liquid crystal polymer (LCP) having lower permittivity, a multilayer resin substrate formed by laminating multiple resin layers formed from fluorocarbon polymers, or a multilayer substrate formed from ceramics other than LTCC. Instead of a multilayer structure, the dielectric substrate 105 may be a single-layer substrate.

The dielectric substrate 105 has a substantially L-shaped cross section, and includes a planar flat portion 130 on which the RFIC 110 is disposed, a planar flat portion 131 in which the radiating elements 121a are disposed, and bent portions 135 that connect the flat portion 130 and the flat portion 131 to each other. The direction normal to the flat portion 130 and the direction normal to the flat portion 131 are substantially orthogonal to each other. Hereinbelow, as illustrated in FIG. 2, the direction normal to the flat portion 130 is also referred to as "a Z-axis direction", the direction normal to the flat portion 131 is also referred to as "an X-axis direction, and a direction perpendicular to the Z-axis direction and the X-axis direction is also referred to as "a Y-axis direction". In the present embodiment, the flat portion 130 can correspond to "a first flat portion" in the present disclosure, the flat portion 131 can correspond to "a second flat portion" in the present disclosure, and the bent portions 135 can correspond to "bent portions" in the present disclosure.

In the present description, "a thickness" indicates the dimension in the direction normal to each of the flat portion 130, the bent portions 135, and the flat portion 130. In the present embodiment, "a width" indicates the dimension in the Y-axis direction.

The RFIC 110 is disposed on the surface of the flat portion 130 (or the first flat portion) facing in the Z-axis negative direction.

The multiple radiating elements 121a are arranged in the flat portion 131 (or the second flat portion) at predetermined intervals apart in the Y-axis direction. When a radio frequency signal is provided from the RFIC 110 to a feed point SP of each radiating element 121a, a radio wave is radiated from the radiating element 121a in the X-axis positive direction. Instead of multiple radiating elements 121a, one radiating element 121a may be provided.

In the present embodiment, the multiple radiating elements 121b are arranged also in the flat portion 130 (or the first flat portion) at predetermined intervals apart in the Y-axis direction. When a radio frequency signal is provided from the RFIC 110 to a feed point SP of each radiating element 121b, a radio wave is radiated from the radiating element 121b in the Z-axis positive direction. The antenna module according to the present disclosure may eliminate the radiating elements 121b.

The bent portions 135 are bent to connect the flat portion 130 and the flat portion 131 whose normal directions are different from each other.

In the present embodiment, as illustrated in FIG. 2, the flat portion 130 and the flat portion 131 are connected by the multiple bent portions 135 arranged at predetermined intervals spaced apart in the X-axis direction. The thickness (the dimension in the normal direction) of each bent portion 135 is smaller than the thickness of the flat portion 130 and the thickness of the flat portion 131. The width (the dimension in the Y-axis direction) of each bent portion 135 is smaller than the width of the flat portion 130 and the width of the flat portion 131.

Figure 3:
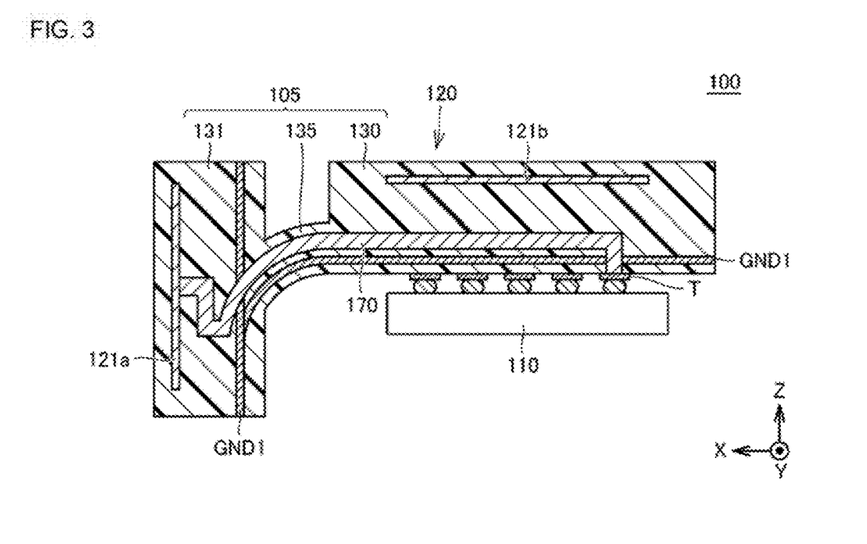
FIG. 3 is a cross-sectional view (Variation 1) of an antenna module.

FIG. 3 is a cross-sectional view of the antenna module 100. All the flat portions 130 and 131 and the bent portions 135 forming the dielectric substrate 105 have a multilayer structure.

In the flat portion 130, the radiating elements 121b, a feeder 170, and a ground electrode GND1 are laminated at predetermined intervals apart in this order from the positive side to the negative side in the Z-axis direction. External terminals T to which the RFIC 110 is connected are disposed on the surface of the flat portion 130 facing the Z-axis negative direction. The radiating elements 121b extend flatwise in an in-plane direction in the flat portion 130. The feeder 170 extends linearly in the X-axis direction. The ground electrode GND1 is disposed in a layer between a layer in which the feeder 170 extends and a surface on which the external terminals T are disposed. The ground electrode GND1 extends flatwise in an in-plane direction in the flat portion 130.

The feeder 170 and the ground electrode GND1 are laminated in each bent portion 135 at a predetermined interval apart in this order from the outer periphery to the inner periphery of the bent portion 135. Each radiating element 121a and the ground electrode GND1 are laminated in the flat portion 131 at a predetermined interval apart in this order from the positive side to the negative side in the X-axis direction.

The feeder 170 and the ground electrode GND1 are integrally formed through the flat portion 130, the bent portions 135, and the flat portion 131. A first end of the feeder 170 is connected to one of the external terminals T on the flat portion 130. A second end of the feeder 170 is connected to one of the radiating elements 121a in the flat portion 131. Thus, in the flat portion 130, the bent portions 135, and the flat portion 131, a microstripline signal line is formed with the feeder 170 and the ground electrode GND1. When radio frequency signals from the RFIC 110 are provided to the radiating elements 121a through the feeder 170, radio waves are radiated from the radiating elements 121a in the X-axis positive direction. In the present embodiment, the feeder 170 can correspond to "a first feeder" according to the present disclosure, and the ground electrode GND1 can correspond to "a first ground electrode" according to the present disclosure.

The radiating elements 121b and the RFIC 110 at the flat portion 130 are connected to each other by a feeder, not illustrated, disposed inside the flat portion 130. When radio frequency signals from the RFIC 110 are provided to the radiating elements 121b, radio waves are radiated from the radiating elements 121b in the Z-axis positive direction.

Although FIG. 3 illustrates an example where the feeder 170 and the ground electrode GND1 extend inside the dielectric substrate 105 (the flat portion 130, the bent portions 135, and the flat portion 131), the feeder 170 and the ground electrode GND1 are not necessarily disposed inside the dielectric substrate 105. For example, the feeder 170 may be disposed on the outer layer on the top surface side of the dielectric substrate 105, and the ground electrode GND1 may be disposed on the outer layer on the back surface side of the dielectric substrate 105.

(Heat Radiation Properties of Antenna Module)

In the antenna module 100, the RFIC 110 generates heat when the RFIC 110 provides radio frequency signals to the radiating elements 121a. The heat generated by the RFIC 110 is transmitted from the external terminals T to the flat portion 130. Thus, the heat transmitted from the RFIC 110 to the flat portion 130, and from there it is desirably, and easily dissipated outside the antenna module 100.

When the feeder 170 has a short length, the heat of the flat portion 130 is easily transmitted to the flat portion 131 through the feeder 170. Thus, the heat transmitted from the RFIC 110 to the flat portion 130 is transmitted to the radiating elements 121a in the flat portion 131, and from there is easily dissipated outside the radiating elements 121a.

However, in the antenna module 100 according to the present embodiment, the bent portions 135 connect the flat portion 130, on which the external terminals T to which the RFIC 110 is connected are disposed, and the flat portion 131, on which the radiating elements 121a are disposed. Because of this structure, the feeder 170 has a long length, and thus the heat of the flat portion 130 is less easily transmitted to the flat portion 131 through the feeder 170. Thus, unless countermeasures are taken, the heat transmitted from the RFIC 110 to the flat portion 130 may remain in the flat portion 130, and the flat portion 130 may overheat.

In view of this situation, the antenna module 100 according to the present embodiment is devised to secure heat radiation properties (more specifically, heat radiation properties of the flat portion 130 to which the RFIC 110 is connected).

Specifically, to facilitate heat transfer with the feeder 170, the thickness (the dimension in the normal direction) of the feeder 170 is greater than the thickness of the ground electrode GND1 at the bent portions 135. When the thickness of the feeder 170 having higher thermal conductivity than a dielectric substance is increased at the bent portions 135, the heat of the flat portion 130 can be easily transmitted to the flat portion 131 through the feeder 170 at the bent portions 135. Thus, the antenna module 100 secures heat radiation properties (heat radiation properties of the flat portion 130), and can easily prevent the flat portion 130 from overheating.

In the present embodiment, not only in the bent portions 135 but also in the flat portion 130 and the flat portion 131, the thickness of the feeder 170 is greater than the thickness of the ground electrode GND1. Thus, the heat of the flat portion 130 can be more easily transmitted to the flat portion 131 through the feeder 170.

In the present embodiment, to improve the heat radiation properties of the bent portions 135, the bent portions 135 have a specific shape. More specifically, the thickness of the bent portions 135 is smaller than the thickness of the flat portion 130. Thus, at each bent portion 135, the dimension from the feeder 170 to the outer peripheral surface of the bent portion 135 is reduced to easily dissipate the heat of the feeder 170 from the outer peripheral surface of the bent portion 135. In addition, the width of each bent portion 135 is smaller than the width of the flat portion 130 and the width of the flat portion 131. Thus, at each bent portion 135, the dimension from the feeder 170 to the side surface of the bent portion 135 is reduced to easily dissipate the heat of the feeder 170 to the outside from the side surface of the bent portion 135.

In the present embodiment, as each feeder 170 has a greater thickness, the feeder 170 has smaller electrical resistance. Thus, the amount of Joule's heat generated by the feeder 170 when a radio frequency signal passes through the feeder 170 is reduced. Thus, the feeder 170 is more easily prevented from overheating.

Tensile stress occurs at the outer periphery of each bent portion 135 when the bent portion 135 is bent. In the present embodiment, the feeder 170 having a greater thickness than the ground electrode GND1 is disposed on the outer periphery of each bent portion 135. The feeder 170 is less easily broken at each bent portion 135.

MODIFICATION EXAMPLE

Variations (modification examples) of the antenna module 100 will be described below.

Modification Example 1

Figure 4:
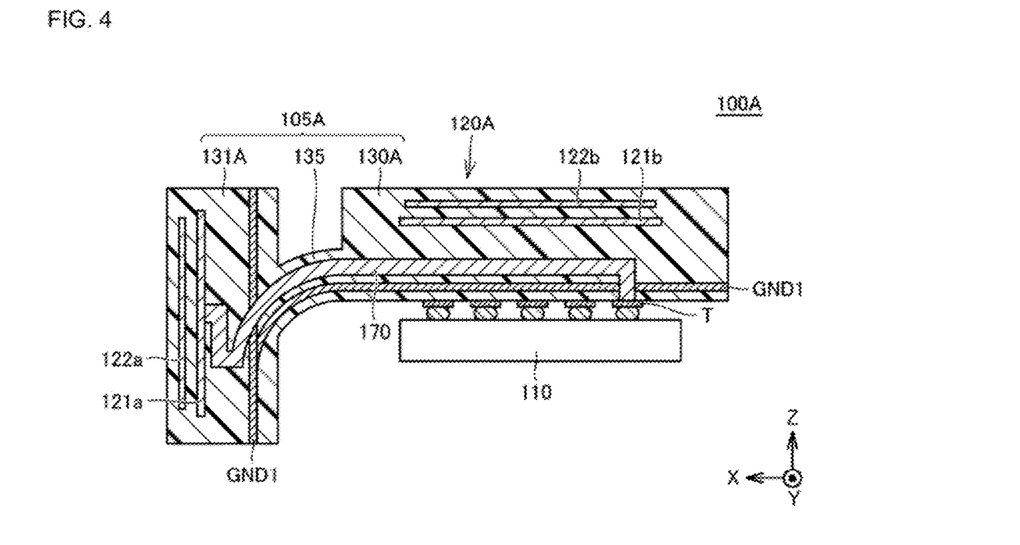
FIG. 4 is a cross-sectional view (Variation 2) of an antenna module.

FIG. 4 is a cross-sectional view of an antenna module 100A according to Modification Example 1. The antenna module 100A is formed by adding radiating elements 122a and 122b to the antenna module 100 illustrated in FIG. 3.

More specifically, the antenna module 100A includes an antenna device 120A and the RFIC 110. The antenna device 120A includes a dielectric substrate 105A including a flat portion 130A, a flat portion 131A, and the bent portions 135.

The flat portion 130A is formed by adding, to the flat portion 130 illustrated in FIG. 3, radiating elements 122b above the radiating elements 121b (on the positive side in the Z-axis direction). The flat portion 131A is formed by adding, to the flat portion 131 illustrated in FIG. 3, radiating elements 122a above the radiating elements 121a (on the positive side in the X-axis direction). In this manner, multiple radiating elements may be laminated in each of the flat portions 130A and 131A.

The radiating elements 122a and 122b added in Modification Example 1 are not connected to the RFIC 110. As illustrated in FIG. 4, additionally disposing the radiating elements 122a and 122b above the radiating elements 121a and 121b enables expansion of the bandwidth of frequencies radiated from the radiating elements 121a and 121b.

The radiating elements 122a and 122b may be additionally disposed below the radiating elements 121a and 121b (on the side closer to the ground electrode GND1). In this case, a dual-band antenna module can be implemented by using the additionally disposed radiating elements 122a and 122b as so-called parasitic elements.

As described above, regardless of a structure where the feeder 170 is connected to the radiating element 121a among the two laminated radiating elements 121a and 122a, the heat conducts between the two radiating elements 121a and 122a spaced at a small distance apart, and thus is radiated to the outside. When the radiating element disposed below (on the side closer to a ground electrode GND2) has a greater size than the radiating element disposed above (on the side further from the ground electrode GND1) when the two radiating elements 121a and 122a are viewed in the X-axis direction, the heat can be radiated to the outside from an area of the radiating element disposed below that does not overlap the radiating element disposed above.

Modification Example 2

Figure 5:
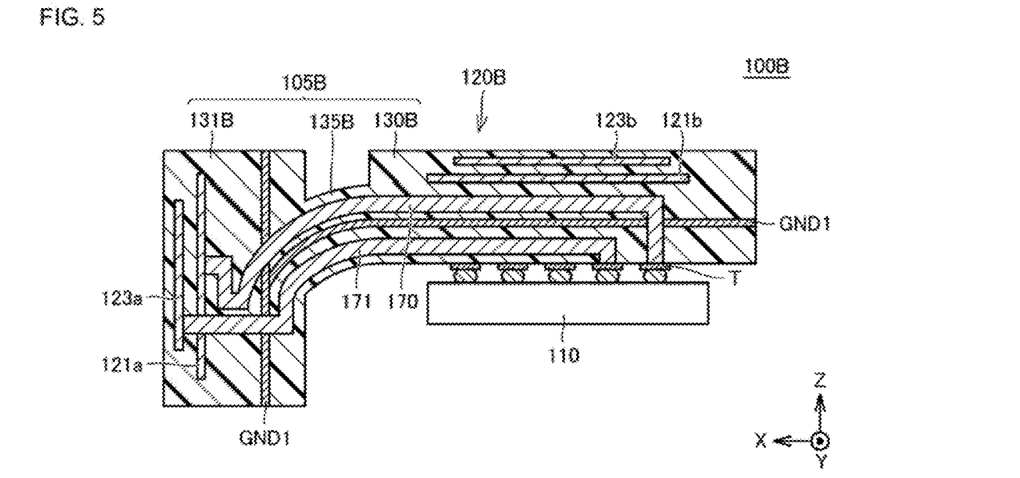
FIG. 5 is a cross-sectional view (Variation 3) of an antenna module.

FIG. 5 is a cross-sectional view of an antenna module 100B according to Modification Example 2. The antenna module 100B is formed by adding radiating elements 123a and 123b and a feeder 171 to the antenna module 100 illustrated in FIG. 3.

More specifically, the antenna module 100B includes an antenna device 120B and the RFIC 110. The antenna device 120B includes a dielectric substrate 105B including a flat portion 130B, a flat portion 131B, and bent portions 135B.

The radiating elements 123b, the radiating elements 121b, the feeder 170, the ground electrode GND1, and the feeder 171 are laminated in the flat portion 130B at predetermined intervals apart in this order from the positive side to the negative side in the Z-axis direction.

The feeder 170, the ground electrode GND1, and the feeder 171 are laminated in each bent portion 135B at predetermined intervals apart in this order from the outer periphery to the inner periphery of the bent portion 135B.

The radiating elements 123a, the radiating elements 121a, and the ground electrode GND1 are laminated in the flat portion 131B at predetermined intervals apart in this order from the positive side to the negative side in the X-axis direction.

The feeder 171 extends through the flat portion 130B, the bent portion 135B, and the flat portion 131B, in a layer facing the feeder 170 with the ground electrode GND1 interposed therebetween. A first end portion of the feeder 171 is connected to the external terminal T on the flat portion 130B. A second end portion of the feeder 171 is connected to the radiating element 123a in the flat portion 131'. Each of the radiating elements 123a and the feeder 171 according to Modification Example 2 can correspond to "a second feeder" in the present disclosure. The RFIC 110 and the radiating elements 123h on or in the flat portion 130B are connected to each other with a feeder not illustrated disposed inside the flat portion 130B.

In this manner, the radiating elements 121a and 123a may be laminated in the flat portion 131B, and the radiating elements 121a and 123a may be connected to the RFIC 110 respectively through the feeders 170 and 171. In this case, the antenna module 100B can be implemented as a dual-band antenna module by providing radio frequency signals with different frequencies to the feeders 170 and 171. When the two feeders 170 and 171 are thus respectively connected to the two laminated radiating elements 121a and 123a, the heat is separately transferred from the flat portion 130B to the flat portion 131B through multiple paths, and thus the heat radiation effect can be further enhanced.

In each bent portion 135B according to Modification Example 2, the two feeders 170 and 171 are laminated in the thickness direction (normal direction) of the bent portion 135B. Thus, each bent portion 135B has a smaller width than in a case where the two feeders 170 and 171 are arranged side by side in the width direction of the bent portions 135B. Thus, the heat of the feeders 170 and 171 can be more easily dissipated to the outside from the side surfaces of each bent portion 135B.

The flat portion 131B may eliminate the radiating elements 123a, and the feeders 170 and 171 may be connected to feed points of each radiating element 121a at two points. In this case, a so-called dual polarization antenna module can be implemented.

Modification Example 3

Figure 6:
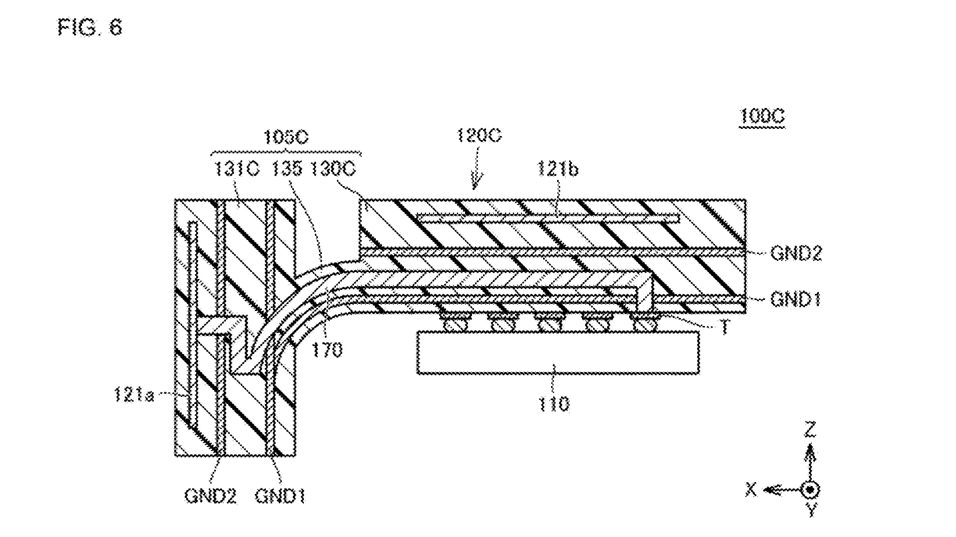
FIG. 6 is a cross-sectional view (Variation 4) of an antenna module.

FIG. 6 is a cross-sectional view of an antenna module 100C according to Modification Example 3. The antenna module 100C is formed by adding ground electrodes GND2 to the antenna module 100 illustrated in FIG. 3.

More specifically, the antenna module 100C includes an antenna device 120C and the RFIC 110. The antenna device 120C includes a dielectric substrate 105C including a flat portion 130C, a flat portion 131C, and the bent portions 135.

The flat portion 130C is formed by adding the ground electrode GND2 to the flat portion 130 illustrated in FIG. 3 in a layer between each radiating element 121b and the feeder 170. Thus, the ground electrode GND2 extends through the flat portion 130C, in a layer facing the ground electrode GND1 with the feeder 170 interposed therebetween. In the flat portion 130C, a stripline signal line is formed with the feeder 170, the ground electrode GND1, and the ground electrode GND2. The ground electrode GND2 functions as a ground electrode of each radiating element 121b.

The ground electrode GND2 is retained within the flat portion 130C without extending to the bent portions 135. Thus, at each bent portion 135, a microstripline signal line is formed with the feeder 170 and the ground electrode GND1. The ground electrode GND2 according to Modification Example 3 can correspond to "a second ground electrode" in the present disclosure.

The flat portion 131C is formed by adding the ground electrode GND2 to the flat portion 131 illustrated in FIG. 3 in a layer between each radiating element 121a and the ground electrode GND1.

In this manner, the ground electrode GND2 may be added in the flat portion 130C in a layer between each radiating element 121b and the feeder 170. Thus, the isolation between the radiating elements 121b in the flat portion 130C and the radiating elements 121a in the flat portion 131C connected to the feeder 170 can be improved. In addition, the heat transfer paths from the ground electrodes GND2 to the outside can be secured in a dispersed manner. Thus, enhancement of the heat radiation effect can be expected.

Modification Example 4

Figure 7:
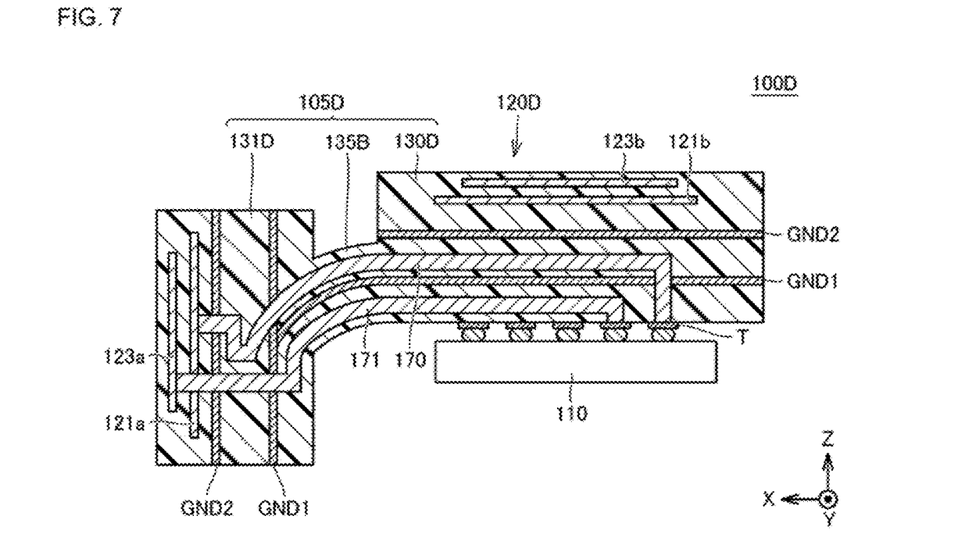
FIG. 7 is a cross-sectional view (Variation 5) of an antenna module.

FIG. 7 is a cross-sectional view of an antenna module 100D according to Modification Example 4. The antenna module 100D is formed by adding the radiating elements 123a and 123b, the feeder 171, and the ground electrode GND2 to the antenna module 100 illustrated in FIG. 3. More specifically, the antenna module 100D is formed by adding the ground electrode GND2 to the antenna module 100B illustrated in FIG. 5.

More specifically, the antenna module 100D includes an antenna device 120D and the RFIC 110. The antenna device 120D includes a dielectric substrate 105D including a flat portion 130D, a flat portion 131D, and bent portions 135B.

The flat portion 130D is formed by adding the ground electrode GND2 to the flat portion 130B illustrated in FIG. 5 in a layer between each radiating element 121b and the feeder 170. Thus, the ground electrode GND2 extends through the flat portion 130D in a layer facing the ground electrode GND1 with the feeder 170 interposed therebetween. The ground electrode GND2 is retained within the flat portion 130D without extending to each bent portion 135.

The flat portion 131D is formed by adding the ground electrode GND2 to the flat portion 131B illustrated in FIG. 5 in a layer between each radiating element 121a and the ground electrode GND1.

As in the case of Modification Example 2, in the flat portion 131D, the radiating elements 121a and 123a may be laminated, and may be connected to the RFIC 110 respectively through the feeders 170 and 171. Thus, the antenna module 100D can be implemented as a dual-band antenna module.

As in the case of Modification Example 3, the ground electrode GND2 may be added into the flat portion 130D in a layer between each radiating element 121b and the feeder 170. Thus, the isolation between the radiating elements 121b in the flat portion 130D and the radiating elements 121a in the flat portion 131D connected to the feeder 170 can be improved.

Each of the radiating elements 123a and the feeder 171 according to Modification Example 4 can correspond to "a second feeder" in the present disclosure. The ground electrode GND2 according to Modification Example 4 can correspond to "a second ground electrode" in the present disclosure.

Modification Example 5

In the antenna module 100 according to the above embodiment, a microstripline is formed with the feeder 170 and the ground electrode GND1 in the flat portion 130 and each bent portion 135. In the antenna module 100C according to Modification Example 3, a stripline is formed with the feeder 170 and the ground electrodes GND1 and GND2 in the flat portion 130C.

Figure 8:
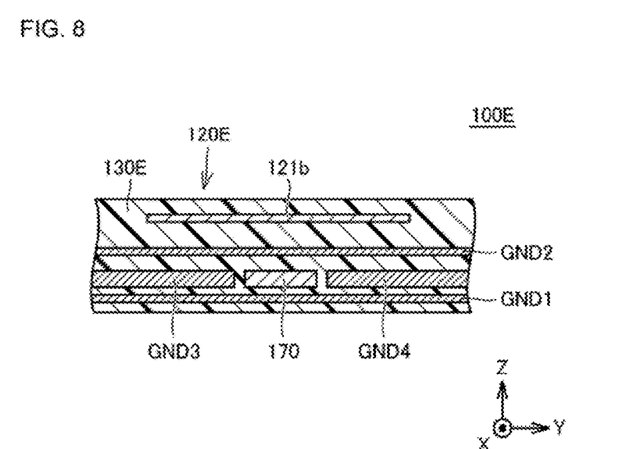
FIG. 8 is a cross-sectional view of a flat portion in an antenna module.

Instead, a so-called coplanar line may be formed by adding, in the layer the same as the layer including the feeder 170, ground electrodes GND3 and GND4 extending on both sides of the feeder 170.

FIG. 8 is a cross-sectional view of a flat portion 130E in an antenna device 120E in an antenna module 100E according to Modification Example 5, taken along a YZ plane orthogonal to the X axis. The flat portion 130E is formed by adding ground electrodes GND3 and GND4 to the flat portion 130C in the antenna module 100C according to Modification Example 3.

The ground electrode GND1 and the ground electrode GND2 are disposed to face each other with the feeder 170 interposed therebetween in the thickness direction (Z-axis direction) of the flat portion 130E. In contrast, the ground electrodes GND3 and GND4 are disposed in the layer the same as the layer including the feeder 170, and extend on both sides of the feeder 170. The thickness of the ground electrodes GND3 and GND4 is the same as the thickness of the feeder 170. Although not illustrated, each of the ground electrodes GND3 and GND4 is integrally formed through the flat portion 130E and the bent portions 135 in the antenna module 100E.

In this manner, by additionally disposing the ground electrodes GND3 and GND4 through the flat portion 130E and the bent portions 135 in the layer the same as the layer including the feeder 170 to extend on both sides of the feeder 170, a coplanar line may be formed with the feeder 170 and the ground electrodes GND3 and GND4. The additionally disposed ground electrodes GND3 and GND4 secure the heat transfer paths from the ground electrodes GND3 and GND4 to the outside. This structure enables dispersion of the heat transfer paths, and further enhancement of the heat radiation effect.

Modification Example 6

In the antenna module 100 according to the above embodiment, the feeder 170 extends through the same layer in the dielectric substrate 105. The ground electrode GND1 also extends through the same layer in the dielectric substrate 105 along the feeder 170.

However, the layer in which the feeder 170 extends may be changed depending on via connection. Similarly, the layer in which the ground electrode GND1 extends may be changed depending on via connection.

Figure 9:
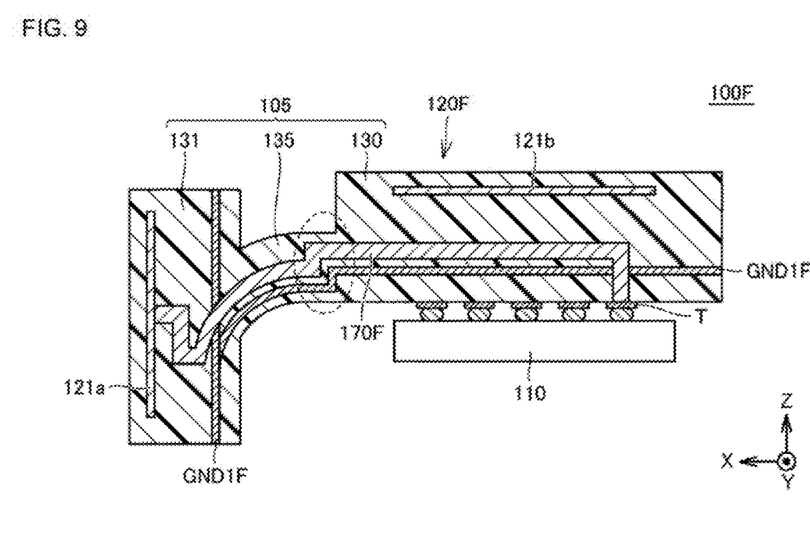
FIG. 9 is a cross-sectional view (Variation 6) of an antenna module.

FIG. 9 is a cross-sectional view of an antenna module 100F according to Modification Example 6. The antenna module 100F is formed by respectively changing the feeder 170 and the ground electrode GND1 in the antenna module 100 illustrated in FIG. 3 to a feeder 170F and a ground electrode GND1F.

The feeder 170F and the ground electrode GND1F extend through the flat portion 130, the bent portions 135, and the flat portion 131. The layer in which the feeder 170F extends is changed by via connection in each bent portion 135. The layer in which the ground electrode GND1F extends is changed by via connection in each bent portion 135.

As described above, the layer in which the feeder 170F extends may be changed by via connection. Similarly, the layer in which the ground electrode GND1 extends may be changed by via connection.

Modification Example 7

In the antenna module 100C according to Modification Example 3 (refer to FIG. 6), the radiating elements 121a and 121b and the ground electrodes GND1 and GND2 are disposed in the same dielectric substrate 105C. In addition, the flat portion 130C, the bent portions 135, and the flat portion 131 are disposed in the same dielectric substrate 105C.

However, the radiating elements 121a and 121b and the ground electrodes GND1 and GND2 may be disposed in different substrates. In addition, the flat portion 130C, the bent portions 135, and the flat portion 131 may be disposed in different substrates.

Figure 10:
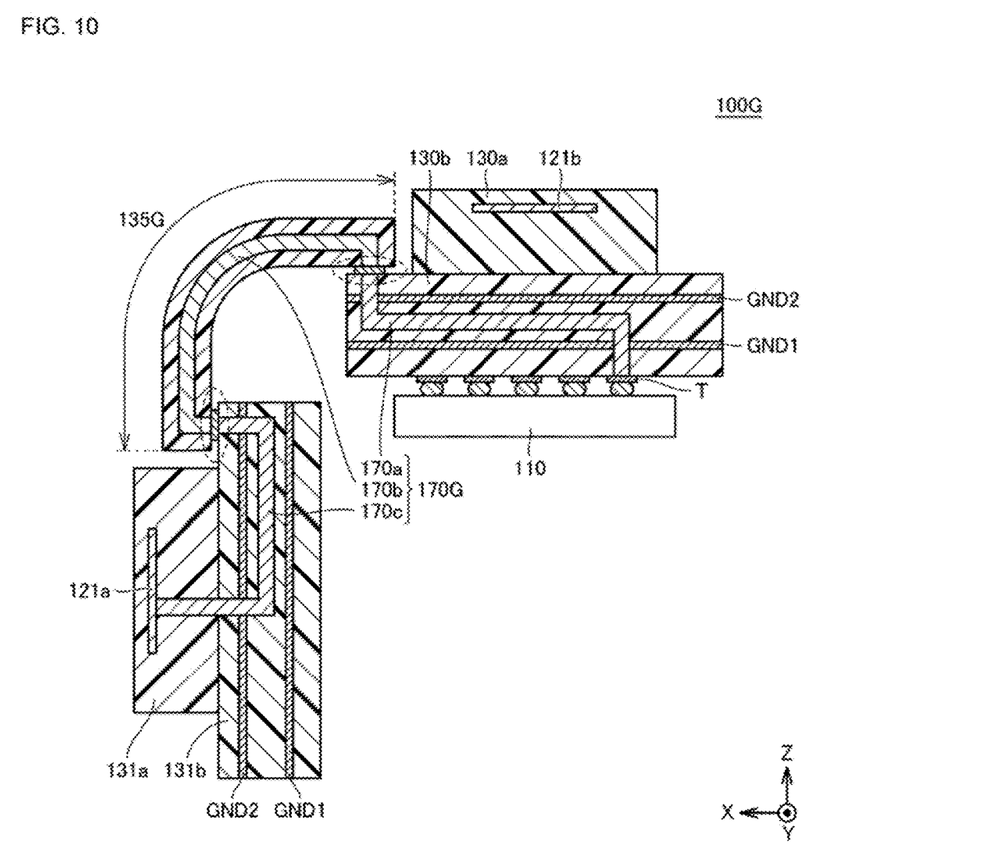
FIG. 10 is a cross-sectional view (Variation 7) of an antenna module.

FIG. 10 is a cross-sectional view of an antenna module 100G according to Modification Example 7. Unlike the antenna module 100C illustrated in FIG. 6, the antenna module 100G separately includes a substrate forming a flat portion 131a in which the radiating elements 121a are disposed, a substrate forming a flat portion 131b in which the ground electrodes GND1 and GND2 are disposed to face the radiating elements 121a, a substrate forming a flat portion 130a in which the radiating elements 121b are disposed, a substrate forming a flat portion 130b in which the ground electrodes GND1 and GND2 are disposed to face the radiating elements 121b, and a substrate forming bent portions 135G.

As a result of separately providing the substrate forming the bent portions 135G, the substrate forming the flat portion 131a, and the substrate forming the flat portion 13b, a feeder 170G is divided into a feeder 170a disposed in the flat portion 131b, a feeder 170b disposed in each bent portion 135G, and a feeder 170c disposed in the flat portion 131a. The feeder 170b and the feeder 170a are connected with a connector on the upper surface (the surface on which the flat portion 130a is in contact) of the flat portion 130b. The feeder 170b and the feeder 170c are connected with a connector on the upper surface (the surface on which the flat portion 131a is in contact) of the flat portion 131b. The connector may be located on either the upper surface, the lower surface, or a side surface of the substrate (the flat portion 130b or 131b).

Modification Example 8

In the antenna module 100 according to the above embodiment, multiple feeders 170 may extend parallel to each other in the same layer in the dielectric substrate 105.

Figure 11:
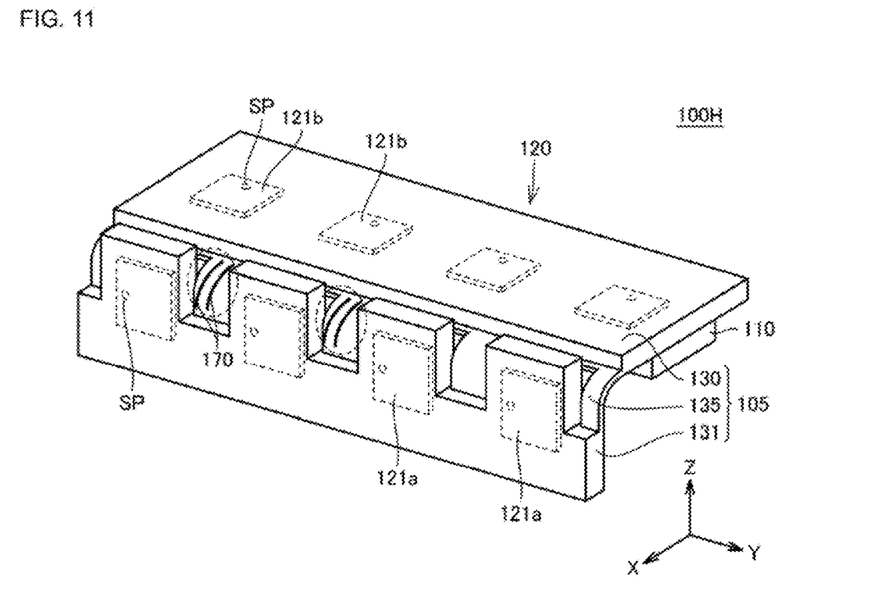
FIG. 11 is a perspective view (Variation 2) of an antenna module.

FIG. 11 is a perspective view of an antenna module 100H according to Modification Example 8. In the antenna module 100H, two feeders 170 extend parallel to each other while being arranged side by side in the Y-axis direction in the same layer in the dielectric substrate 105 (the bent portions 135). The antenna module may be modified in this manner.

Modification Example 9

Figure 12:
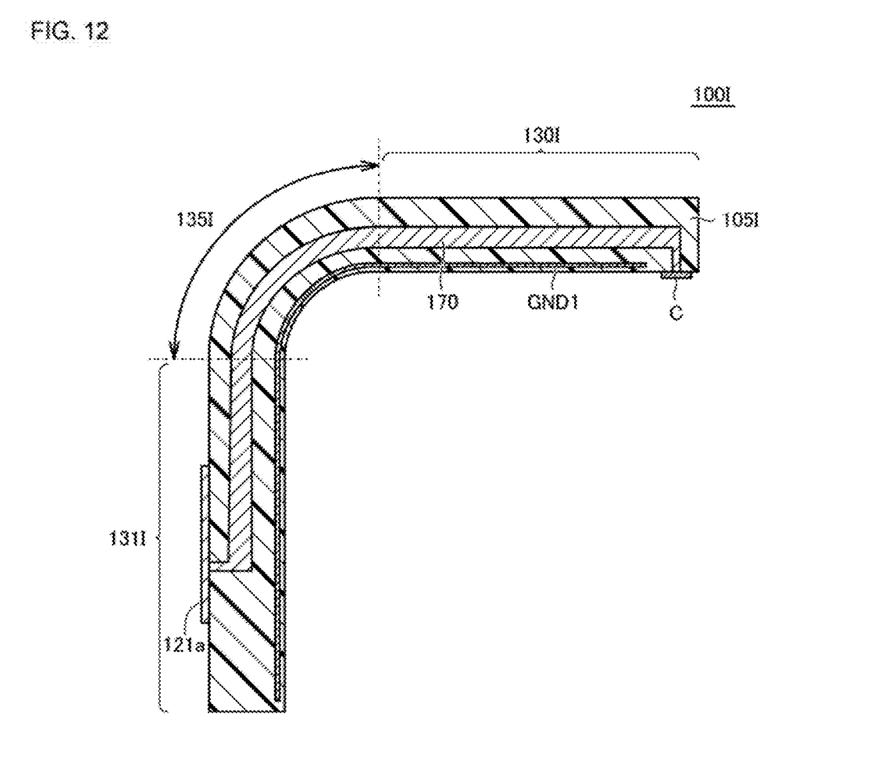
FIG. 12 is a cross-sectional view (Variation 8) of an antenna module.

FIG. 12 is a perspective view of an antenna module 100I according to Modification Example 9. In the antenna module 100I, a flat portion 130I (a first flat portion), bent portions 135I, and a flat portion 131I (a second flat portion) are formed by bending one flexible substrate 105I in which the feeder 170 and the ground electrode GND1 extend.

A first end of the feeder 170 is connected to a connector terminal C disposed at the flat portion 130I (the first flat portion). The connector terminal C is connectable to a RFIC (not illustrated) mounted on a different substrate. A second end of the feeder 170 is connected to each radiating element 121a disposed at the flat portion 131I (the second flat portion).

Also in the antenna module 100I, the heat of the flat portion 130I transmitted from the RFIC mounted on the different substrate through the connector terminal C can be easily transmitted to the flat portion 131I through the feeder 170 in each bent portion 135I. Thus, the antenna module 100I secures the heat radiation properties (heat radiation properties of the flat portion 130I).

The features in the above embodiment and Modification Examples 1 to 8 of the embodiment may be combined as appropriate within a range not causing inconsistency.

The embodiments disclosed herein are mere examples in all respects and to be construed as nonlimitative. The scope of the present disclosure is defined by the scope of claims instead of the description of the above embodiments, and is intended to include all the changes within the scope of claims and their equivalents.

REFERENCE SIGNS LIST 10 communication device
100, 100A to 100I antenna module
105, 105A to 105D dielectric substrate
105I flexible substrate
111A to 111D, 113A to 113D, 117 switch
112AR to 112DR low-noise amplifier
112AT to 112DT power amplifier
114A to 114D attenuator
115A to 115D phase shifter
116 multiplexer/diplexer
118 mixer
119 amplifier circuit
120, 120A to 120D antenna device
121, 121a, 121b, 122a, 122b, 123a, 123b radiating element
130, 130A to 130D, 130I, 130a, 130b, 131, 131A to 131D, 131I, 131a, 131b flat portion
135, 135B, 135I bent portion
170, 170F, 170G, 171 feeder
GND1, GND1F, GND2 ground electrode
SP feed point
T external terminal

The invention claimed is:

1. An antenna module, comprising:
a first radiating element; and
a dielectric substrate,
wherein the dielectric substrate includes
a first flat portion on which an external terminal is disposed,
a second flat portion in which the first radiating element is disposed,
a bent portion that connects the first flat portion and the second flat portion to each other,
a first feeder that extends through the first flat portion, the bent portion, and the second flat portion so as to connect the external terminal and the first radiating element to each other, and
a first ground electrode that extends through the first flat portion, the bent portion, and the second flat portion along the first feeder, and
wherein at the bent portion, the first feeder has a thickness greater than a thickness of the first ground electrode.

2. The antenna module according to claim 1, wherein the bent portion of the dielectric substrate has a thickness smaller than a thickness of the first flat portion of the dielectric substrate.

3. The antenna module according to claim 1,
wherein at the first flat portion, a second ground electrode extends in a layer that faces the first ground electrode with the first feeder interposed therebetween, and
wherein the second ground electrode does not extend through the bent portion.

4. The antenna module according to claim 2,
wherein at the first flat portion, a second ground electrode extends in a layer that faces the first ground electrode with the first feeder interposed therebetween, and
wherein the second ground electrode does not extend through the bent portion.

5. The antenna module according to claim 3,
wherein the first ground electrode and the second ground electrode are disposed on both sides of the first feeder in a thickness direction of the dielectric substrate, and
wherein at each of the first flat portion, the bent portion, and the second flat portion, a third ground electrode and a fourth ground electrode extend while being disposed on both sides of the first feeder in a direction orthogonal to the thickness direction.

6. The antenna module according to claim 4,
wherein the first ground electrode and the second ground electrode are disposed on both sides of the first feeder in a thickness direction of the dielectric substrate, and
wherein at each of the first flat portion, the bent portion, and the second flat portion, a third ground electrode and a fourth ground electrode extend while being disposed on both sides of the first feeder in a direction orthogonal to the thickness direction.

7. The antenna module according to claim 1, wherein at the bent portion, the first feeder is disposed closer to an outer periphery of the bent portion than the first ground electrode.

8. The antenna module according to claim 2, wherein at the bent portion, the first feeder is disposed closer to an outer periphery of the bent portion than the first ground electrode.

9. The antenna module according to claim 3, wherein at the bent portion, the first feeder is disposed closer to an outer periphery of the bent portion than the first ground electrode.

10. The antenna module according to claim 4, wherein at the bent portion, the first feeder is disposed closer to an outer periphery of the bent portion than the first ground electrode.

11. The antenna module according to claim 5, wherein at the bent portion, the first feeder is disposed closer to an outer periphery of the bent portion than the first ground electrode.

12. The antenna module according to claim 6, wherein at the bent portion, the first feeder is disposed closer to an outer periphery of the bent portion than the first ground electrode.

13. The antenna module according to claim 1,
wherein the dielectric substrate also includes a second feeder, and
wherein the second feeder extends through the first flat portion, the bent portion, and the second flat portion, in a layer that faces the first feeder with the first ground electrode interposed therebetween.

14. The antenna module according to claim 2,
wherein the dielectric substrate also includes a second feeder, and
wherein the second feeder extends through the first flat portion, the bent portion, and the second flat portion, in a layer that faces the first feeder with the first ground electrode interposed therebetween.

15. The antenna module according to claim 3,
wherein the dielectric substrate also includes a second feeder, and
wherein the second feeder extends through the first flat portion, the bent portion, and the second flat portion, in a layer that faces the first feeder with the first ground electrode interposed therebetween.

16. The antenna module according to claim 13,
wherein at the second flat portion, a second radiating element is disposed in addition to the first radiating element, and
wherein the second feeder connects the external terminal and the second radiating element to each other.

17. The antenna module according to claim 1, wherein the bent portion has a width that is smaller than a width of the first flat portion.

18. The antenna module according to claim 1, wherein the first feeder and the first ground electrode extend through the first flat portion, the bent portion, and the second flat portion.

19. The antenna module according to claim 2, wherein the first feeder and the first ground electrode extend through the first flat portion, the bent portion, and the second flat portion.

20. The antenna module according to claim 1, further comprising:
a feeding component connected to the external terminal on the first flat portion to provide a radio frequency signal to the first radiating element.

* * * * *